(12) United States Patent
McEwen et al.

(10) Patent No.: US 6,310,739 B1
(45) Date of Patent: Oct. 30, 2001

(54) METHOD AND SYSTEM FOR DETECTION RECORDING MEDIA DEFACTS

(75) Inventors: Peter A. McEwen, Santa Clara; Bahjat Zafer, Sunnyvale, both of CA (US); Kelly K. Fitzpatrick, Westborough, MA (US); Ke Han, Davis, CA (US); Steve Aronson, San Jose, CA (US); Kevin Fisher, Palo Alto, CA (US)

(73) Assignee: Maxtor Corporation, Longmont, CO (US)

(*) Notice: Subject to any disclaimer, the term of this patent is extended or adjusted under 35 U.S.C. 154(b) by 0 days.

(21) Appl. No.: 09/283,351

(22) Filed: Mar. 31, 1999

(51) Int. Cl.⁷ ................................. G11B 5/02; G11B 5/09
(52) U.S. Cl. .................... 360/25; 360/46; 360/53
(58) Field of Search .................. 360/46, 53, 25, 360/31

(56) References Cited

U.S. PATENT DOCUMENTS 5,563,746 * 10/1996 Bliss ........................................ 360/53
5,737,342 * 4/1998 Ziperovich ............................ 371/25.1
5,880,901 * 3/1999 Smith et al. .............................. 360/75
6,088,176 * 7/2000 Smith et al. ............................. 360/46
6,101,227 * 8/2000 Glover .................................. 375/341
6,104,188 * 8/2000 Coker et al. .......................... 324/212

* cited by examiner

*Primary Examiner*—Regina Y. Neal
(74) *Attorney, Agent, or Firm*—Michael Zarrabian

(57) ABSTRACT

A discrete-time filtering method for identifying defects in a magnetic medium, comprising the steps of: reading data signals from at least a portion of the medium; sampling the data signals to generate discrete time sample data; processing the sample data in a discrete time filter to detect deviation of the signal corresponding to media defects; and comparing the deviation of the signal to one or more threshold values to identify corresponding defect types on the recording medium. The filter can be configured to have an impulse response substantially matched to deviation of the signal corresponding to media defects.

34 Claims, 6 Drawing Sheets

METHOD AND SYSTEM FOR DETECTION RECORDING MEDIA DEFACTS

FIELD OF THE INVENTION

The present invention relates to detecting defects in magnetic media, and more particularly, to detecting defects in magnetic media due to undesirable reduction or increase of magnetic material on the magnetic media.

BACKGROUND

Defects in magnetic media such as data disks in disk drives can cause data loss or drive damage. Typically, a defect includes a reduction in the magnetic material at a certain point on the surface of a magnetic medium. The reduction of the magnetic material below a standard level results in a reduction of the signal amplitude and is referred to as a "dropout". The defect can also include an increase in the magnetic material at a certain point on the surface of a magnetic medium as a raised feature. The increase in the magnetic material above a standard level results in an increase of the signal amplitude and is referred to as a "dropin". In a disk drive, if the raised feature on the data disk medium is high enough to hit the read heads, the resulting friction causes heating of the heads, which in magneto resistive heads generates an unwanted voltage transient at the output of the head. The transient voltage is referred to as a thermal asperity (TA), and the corresponding defect is referred to as a TA defect. Therefore, it is necessary to accurately identify defects such as dropins, dropouts and TAs during disk drive self-scans so that disk sectors containing defects are mapped out and not used to store data thereon. A case where a defect is not identified is referred to as a "missed defect", and a case where a defect is falsely identified is referred to as a "false alarm". If a sector containing a defect is not mapped out, attempts to read data from the sector can generate a multitude of errors which many error correction codes (ECC) cannot correct. On the other hand, if too many sectors that do not contain defects are mapped out, the capacity of the disk drive is needlessly reduced.

Conventional methods of identifying defects rely on detecting bit errors as indication of defects. A data pattern is written to the disk, and then read back. The data read back is compared with the data pattern for mismatches. Multiple passes are used in order to obtain acceptable defect mapping accuracy. A certain window length is selected such that errors occurring within the same window on different passes indicate a defect in that window. However, a major disadvantage of such methods is their high rate of false alarm. Random noise in reading data from the data disk causes a high rate of bit mismatches, and as such, many sectors are falsely mapped out due to the detection method mistaking noise for defects. The problem is worse in disk drives which utilize lower signal-to-noise ratio, causing significantly higher false bit errors. Further, generally the window must be large enough to account for the worst case spindle-speed variation between subsequent passes. This increases the probability of false bit errors due to random noise occurring within the same window on different passes, and many sectors without defects are unnecessarily mapped out.

Another disadvantage of conventional methods is the length of time required for defect mapping. A shorter defect mapping period reduces manufacturing costs. With any defect identification method, typically it may be necessary to perform more than one pass in order to achieve acceptable missed defect and false alarm probabilities for a desired defect mapping accuracy. A pass would normally include a single write followed by a single read. Other times, only one write is performed with multiple reads, wherein a pass refers to a single read. Repetitive passes allow distinguishing between repetitive errors due to defects and random errors due to noise. As such, greater defect mapping accuracy is achieved when more passes are used. However, improving the defect identification accuracy reduces the number of passes required to achieve the same or better missed defect and false alarm probabilities.

Yet another disadvantage of conventional detection methods is their inability to provide information about the type of defect. In the bit error detection method described above, the detection method only provides information about the location of the error. No information about the type or severity of the error is provided.

There is, therefore, a need for a method of accurately detecting defects in magnetic media. There is also a need for such a method to reduce both missed defect and false alarm probabilities. There is also a need for such a method to reduce the number of required passes. There also a need for such a method to reduce the time required for defect mapping. There is also a need for such a method provide information about the type of defect in a magnetic medium.

SUMMARY

The present invention satisfies these needs. In one embodiment, the present invention provides a discrete-time filtering method for identifying defects in a magnetic medium, comprising the steps of: reading data signals from at least a portion of the medium; sampling the data signals to generate discrete time sample data; processing the sample data in a discrete time filter to detect deviation of the signal corresponding to media defects; and comparing the deviation of the signal to one or more threshold values to identify corresponding defect types on the recording medium. The filter can be configured to have an impulse response substantially matched to deviation of the signal corresponding to media defects.

Preferably, a data pattern is generated and recorded on said portion of the medium before reading the data signals, wherein the data pattern causes said data signals to have a substantially predetermined shape. The data pattern can comprise a random data pattern or a deterministic data pattern. In the latter case, the data pattern can comprise a periodic data pattern such as a periodic binary data alternating in value. The filter can be configured to have an impulse response substantially matched to the data pattern, wherein the filter generates filtered data, and the filtered data is compared to one or more threshold values to detect defects on the recording medium. The discrete time filter can have length being a multiple of the period of the data pattern. Further, the discrete time filter can comprise a moving average filter substantially matched to deviation of the signal corresponding to media defects.

In another aspect, the present invention provides a system embodying the method of the present invention for detecting defects in magnetic media.

BRIEF DESCRIPTION OF THE DRAWINGS

These and other features, aspects and advantages of the present invention will become better understood with regard to the following description, appended claims and accompanying drawings where:

DESCRIPTION

Figure 1:
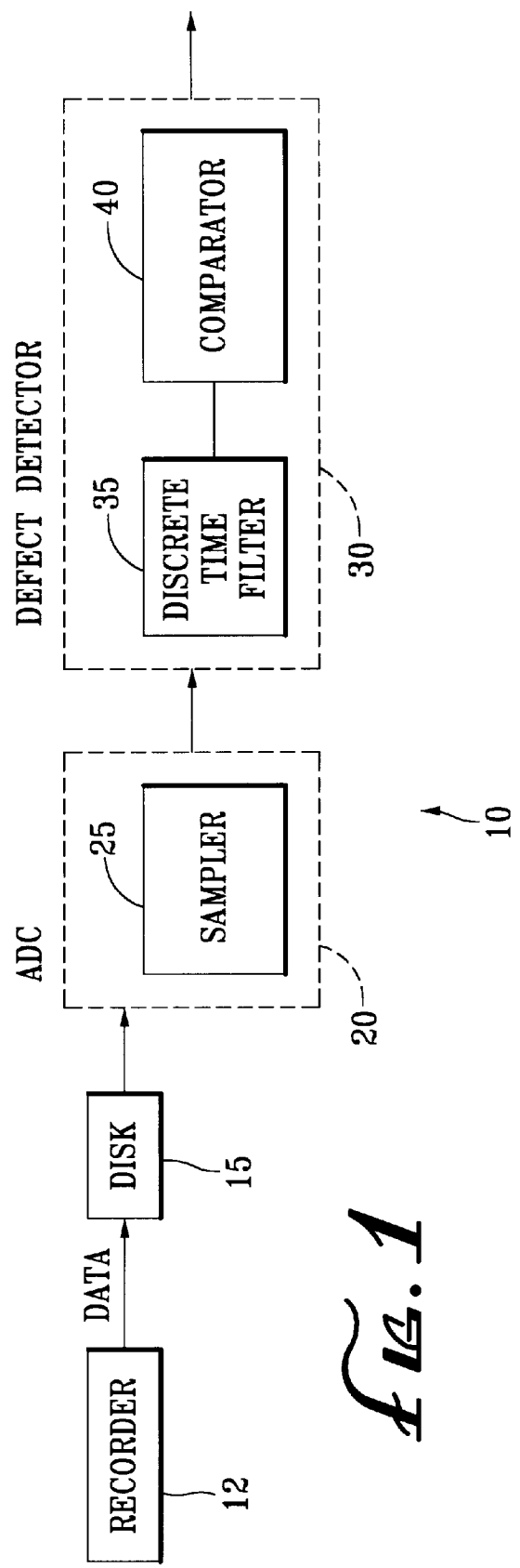
FIG. 1 shows a block diagram of the architecture of a magnetic recording system in which a method embodying aspects of the present invention can be implemented.

FIG. 1 shows a block diagram of the architecture of a magnetic recording system in which a method embodying aspects of the present invention for detecting media defects can be implemented. The magnetic recording system 10 comprises a magnetic media device 15 such as a disk or tape drive, an analog to digital converter 20 (ADC) including a discrete time sampler 25, and a defect detector 30 including at least one discrete-time filter 35 and at least one comparator 40.

Figure 2:
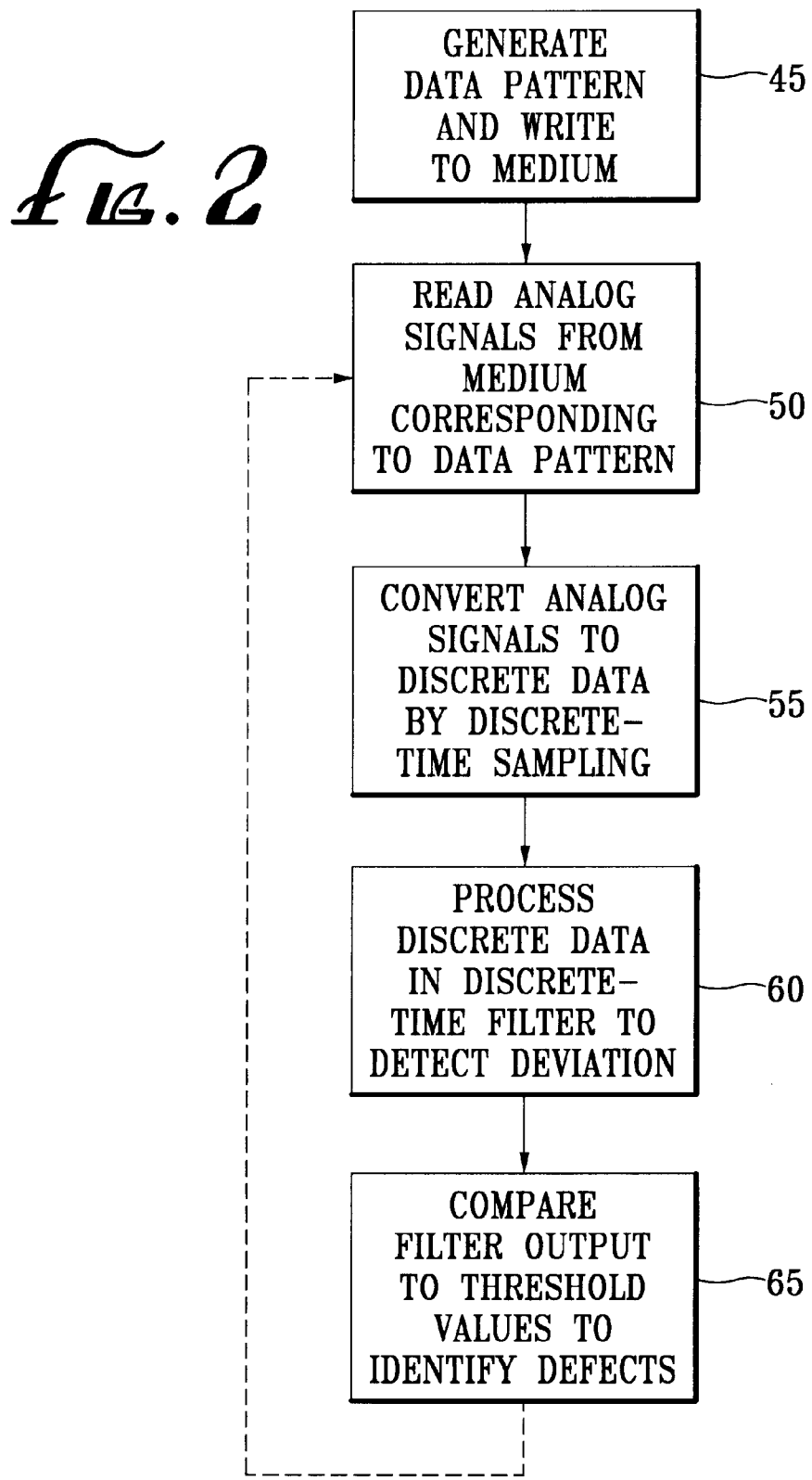
FIG. 2 is an example flowchart of an embodiment of a method of detecting media defects by discrete-time filtering in FIG. 1 according to the present invention.

Referring to FIG. 2, in one embodiment of the method of the present invention, discrete-time filtering is utilized to detect media defects such as dropins and dropouts on the recording medium 15. A data pattern is generated and written to at least a portion of the medium 15 by a recorder 12 (step 45). Thereafter analog data signals corresponding to the data pattern are read from said portion of the medium 15 using a magnetic read head positioned over the magnetic medium 15 (step 50). The data signals are converted to discrete data and sampled by the sampler 25 to generate discrete time samples (step 55) such as 6-bit data samples. The sample data is processed in the discrete time filter 35 to detect deviation of the signal corresponding to media defects (step 60). The output of the filter is compared to one or more threshold values by the comparator 40 to identify corresponding defect types on the recording medium (step 65).

In one embodiment, the discrete time filter 35 is configured to detect a deviation in the sample data from a predetermined ideal signal generated by the data pattern without any defects on a recording medium. A sliding window having a typical length of about 256 bits of the sampled data can be utilized, and the sample data is input to the filter 35. For a dropout, the deviation of the signal comprises a reduction of the read signal amplitude. As such, a dropout is detected when the amplitude of the output signal of the filter 35 is less than a selected first threshold value. For a dropin, the deviation of the signal comprises an increase of the read signal amplitude. As such, a dropin is detected when the amplitude of the output signal of the filter 35 is greater then a selected second threshold value.

In an embodiment of the present invention, the discrete time filter 35 is configured to have an impulse response substantially matched to deviation of the signal corresponding to media defects. Alternatively, in another embodiment of the present invention, the discrete-time filter 35 is configured to have an impulse response substantially matched to the sampled data pattern. In either embodiment, the filter 35 is effectively matched to the signal caused by a media defect such as the signal caused by a TA, wherein the filter 35 enhances the signal such that the defect can be detected by the defect detector 30 when the signal is compared to threshold values by the defect detector 30. Preferably, the discrete-time filter 35 is configured to have an impulse response substantially matched to the ideal read signal from a data pattern without any media defects, and substantially to the deviation of the signal generated by a type of media defect.

In an example embodiment of the present invention, preferably the data pattern comprises a periodic data pattern such as binary data alternating in value. For example a "2T" pattern of the form 1, 1, 0, 0 has a transition every two bits, and generates a substantially sinusoidal read signal. For example, on a data disk track, the track medium is magnetized first in one direction in a first two bit cells and the then in the opposite direction in the next two bit cells. Because of frequent transitions, the 2T pattern provides good coverage of the media for defect identification, and provides a high signal to noise ratio which makes defect identification more accurate. Other periodic data patterns such as 3T and 4T are also possible and contemplated by the present invention. The data pattern can alternatively be a random data pattern.

Sample data generated from the 2T data pattern comprises one or more repetitions of at least a portion of the sequence P, 0, −P and 0, and a discrete time filter 35 substantially matched to a wide range of defects has coefficients comprising one or more repetitions of at least a portion of the sequence 1, 0, −1 and 0. As such, the positive peaks P in the sample data are multiplied by 1, the zero crossing are multiplied by zero and the negative peaks −P are multiplied by −1. Therefore, all the peaks in the sample data are converted into positive peaks and summed. If there are no defects represented by the sample data processed by the filter 35, the output of the filter 35 is the sum of all the data peaks in the filter according to the length of the filter N, represented by N×P.

In one example embodiment, a threshold value equal to N×P/2 for processing the sample data is selected. The output of the filter 35 is compared to said threshold value to determine if the sample data processed by the filter 35 includes deviation of the signal corresponding to media defects, and the type of such media defects. For a subset of the sample data processed by the filter 35, if the output of the filter 35 is equal to or above the threshold value, then there is no defect on the portion of the medium 15 corresponding to the sample data. However, if the output of the filter 35 is below the threshold value, then there is a defect on said portion of the medium 14.

For efficiency a plurality of filters 35 can be utilized to simultaneously process the sample data to detect various types of media defects, wherein the filters 35 have different lengths and coefficients. The length of each filter 35 is selected to be long enough for processing portions of the sample data which allow identification of deviation of the signal corresponding to defects. Filters of length two having coefficients of the form 1, 0, −1 and filters of length four having coefficients of the form 1, 0, −1, 0, 1, 0, −1 are effective in detecting relatively severe defects with short-to-medium lengths. While a filter of length eight having coefficients of the form 1, 0, −1, 0, 1, 0, −1, 0, 1, 0, −1, 0, 1, 0, −1 is effective in detecting longer, less severe defects.

Figure 3:
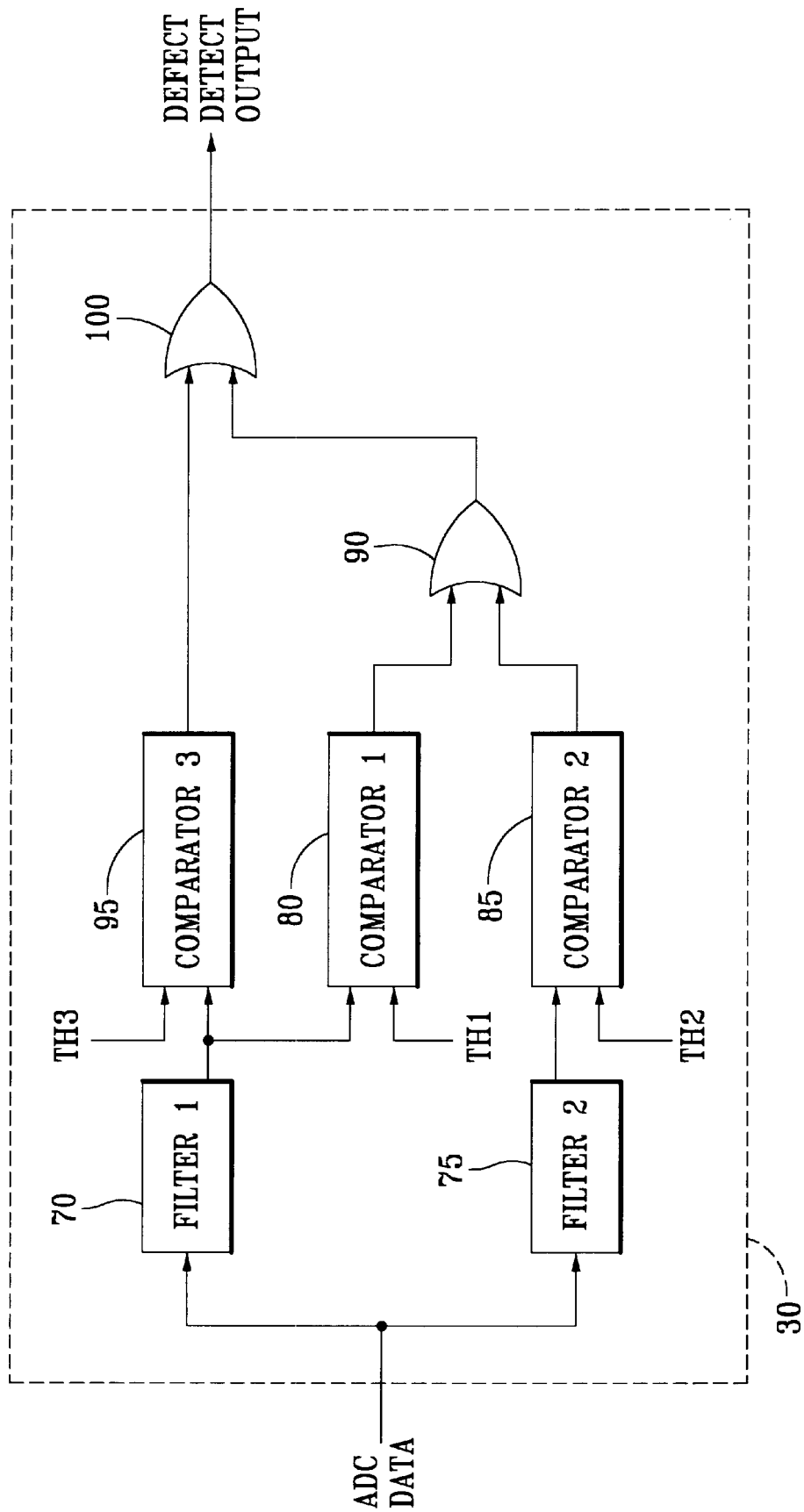
FIG. 3 shows an example block diagram of the architecture of an embodiment of the defect detector of FIG. 1.

Referring to FIG. 3, an embodiment of the defect detector of FIG. 1 comprises: (a) a first discrete-time filter 70 having a length four and coefficients 1, 0, −1, 0, 1, 0, −1, and (b) a second discrete-time filter 75 having a length two with coefficients 1, 0, −1, or of length eight with coefficients 1, 0, −1, 0, 1, 0, −1, 0, 1, 0, −1, 0, 1, 0, −1. The output of the first filter 70 is compared to a first threshold value TH1 in a first comparator 80, and the output of the second filter 75 is compared to a second threshold value TH2 in a second comparator 85. The outputs of the first and the second comparators 80, 85 are input to a first OR gate 90, wherein an output value 1 for the first OR gate 90 indicates a dropout defect. The output of the first filter 70 is compared to a third threshold value TH3 in a third comparator 95, wherein an output value 1 for the third comparator 95 indicates a dropin defect. The outputs of the first OR gate 90 and the third comparator 95 are input to a second OR gate 100, wherein a value of 1 as the output of the second OR gate 100 indicates a defect in the medium 15.

Figure 4:
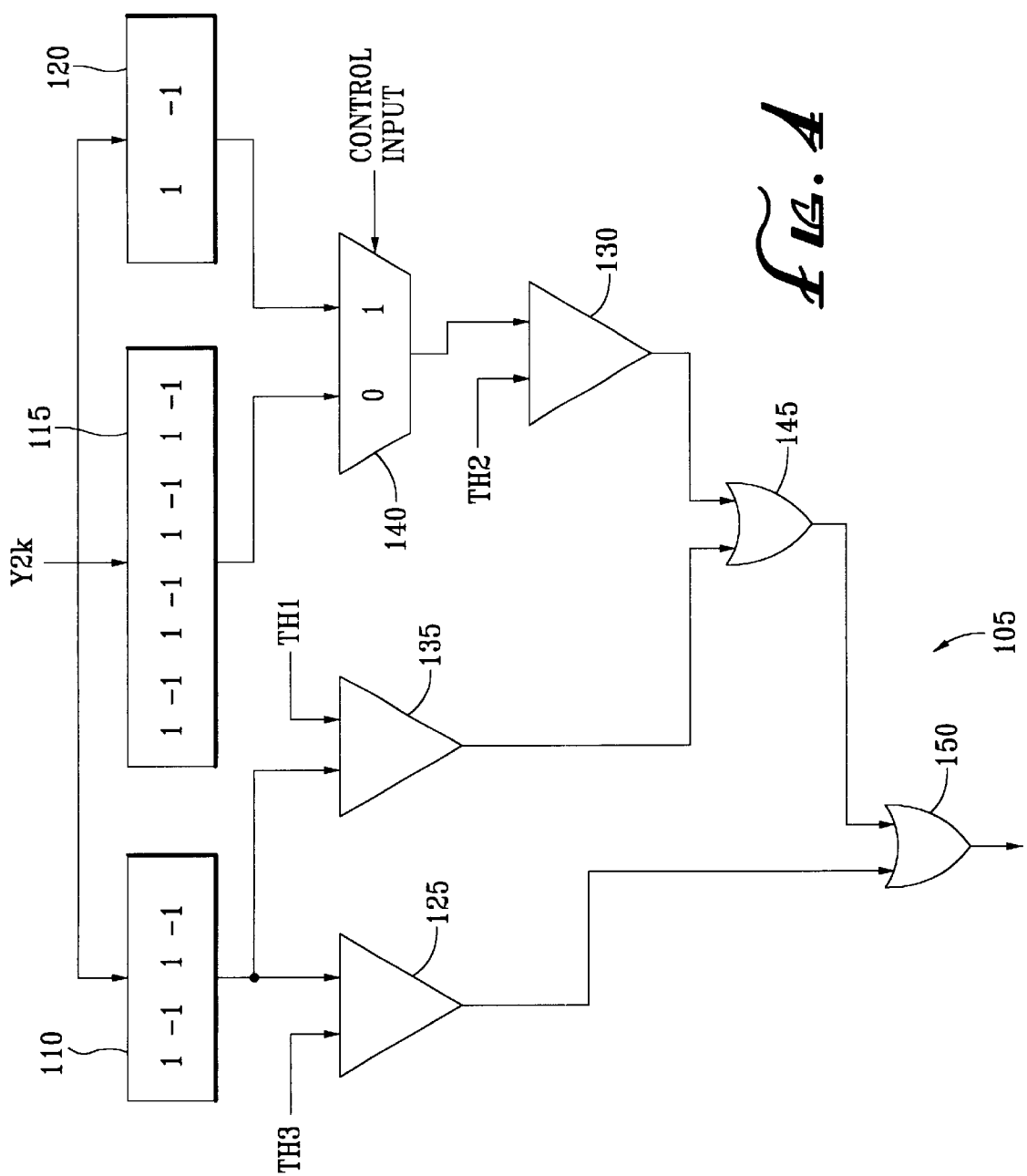
FIG. 4 shows an example architecture of a logic circuit implementation of the defect detector of FIG. 3.

FIG. 4 shows an example architecture of a logic circuit 105 implementation of the defect detector 30 of FIG. 3. The input to the logic circuit 105 comprises the output $Y_k$ of the ADC 20 in the form of $Y_{2k}$, wherein k comprises 0, 1, 2, .... Since the filter coefficients discussed above are 0 for every other input sample data, every other sample data of the ADC output will be multiplied by 0 by the filter 35 of the detector 30. Therefore, the input of the logic circuit 105 is selected to be every other sample bit from the output of the ADC 20 with a phase the corresponds to non-zero inputs, in the form of $Y_{2k}$. For the 2T pattern, only every other bit in the sample data which is not multiplied by a 0 coefficient is processed in the filters 35. This is represented by $Y_{2k}$ as the input to the logic circuit 105, and bit numbers 0, 2, 4, 8 ... etc. in the sample data are processed. Therefore, the length of each filter 35 is defined by the number of non-zero coefficients of the filter 35.

The logic circuit 105 comprises three discrete time filters 110, 115 and 120, respectively. The first discrete-time filter 110 has a length of four with coefficients 1, −1, 1, −1. The output of the first filter 110 is a scalar value and is scaled back by dividing the scalar value by four, the length of the first filter 110. The second discrete-time filter 115 has a length of eight with coefficients 1, −1, 1, −1, 1, −1, 1, −1. The output of the second filter 115 is a scalar value and is scaled back by dividing the scalar value by eight, the length of the second filter 115. The third discrete-time filter 120 has a length of two with coefficients 1, −1. The output of the third filter 120 is a scalar value is scaled back by dividing the scalar value by two, the length of the third filter 120.

The logic circuit 105 further comprises three comparators 125, 130 and 135. The scaled output of the first filter 110 and a threshold value TH3 are input to the comparator 125 to detect dropins. If the output of the first filter 110 is greater than the threshold value TH3, then the output of the comparator 125 is one to indicate a dropin, otherwise the output of the comparator 125 is zero. The scaled output of the first filter 110 and a threshold value TH1 are input to the third comparator 135 to detect dropouts. If the output of filter 110 is less than the threshold value TH1, then the output of the comparator 135 is one, otherwise the output of the comparator 135 is zero.

The scaled outputs of the second and third filters 115, 120 are input to a multiplexer (Mux) 140, wherein the Mux 140 includes a control input for selecting either the output of the second filter 115 as the Mux output when the control input is zero, or for selecting the output of the third filter 120 as the Mux output when the control input is one. As such, the output of the Mux 140 is a scalar value comprising either the scalar output of the second filter 115 or the scalar output of the third filter 120. The output of Mux 140 and a threshold value TH2 are input to the comparator 130 to detect dropouts. If the output of Mux 140 is less than the threshold value TH2, then the output of the comparator 130 is one, otherwise the output of the comparator 130 is zero.

The logic circuit 105 further comprises two OR gates 145 and 150, respectively. The outputs of the comparators 130 and 135 are input to the OR gate 145, wherein if the output of either of the comparators 130 and 135 is one, then the output of the OR gate 145 is one to indicate a dropout, otherwise, the output of the OR gate 145 is zero. The output of the OR gate 145 and the output of the comparator 125 are input to the OR gate 150, wherein when the output of either the OR gate 145 or the comparator 125 is one, the output of the OR gate 150 is one to indicate a defect. The logic circuit 105 can further include means for outputting the defect information based on bit-by-bit, byte-by-byte or symbol-by-symbol selection. As such, for example, if there is an error in a bit on the medium, the logic circuit 105 can identify a byte or symbol in which the bit error occurred.

In an example scenario, the control input of the Mux 140 is one and the output of the filter 120 is selected by the Mux 140 as input to the comparator 130. If the output of the filter 120 is 12 and the threshold value TH2 is 15, because 12 is less than 15, the output of the comparator 130 is one, indicating detection of a dropout by the filter 120. Further, if the output of the filter 110 is 17, the threshold value TH3 is 22, and the threshold value TH1 is 15, because 17 is greater than 15 the output of the comparator 135 is zero, indicating that no dropout is detected by the filter 110. As such, the output of the OR gate 145 is one, indicating a dropout in general. Further, because 17 is less than 22, the output of the comparator 125 is zero, and no dropin is detected, whereby the output of the OR gate 150 is one indicating a defect was detected.

A discrete-time filtering method according to the present invention identifies defects more accurately than the prior bit-error based methods. This is because the discrete-time filter 35 is matched to said ideal signal and approximately matched to a wide range of defects. For the same false alarm rate as the prior methods, the missed defect rate for the method of the present invention is significantly less than the missed defect rate for the prior method. And, for the same missed defect rate as the prior methods, the false alarm rate for the method of the present invention is significantly less than the false alarm rate for the prior method.

Further, for disk drives operating at lower signal to noise ratio and higher bit rates, the conventional bit error method requires more than five passes to provide acceptable defect detection accuracy. By contrast, since the method of the present invention provides better defect detection accuracy, the number of passes required for such disk drives need not be increased, and can indeed be reduced to three or two passes, resulting in shorter defect detection time and cost reductions.

Further, the method of the present invention for defect detection can be used to provide more information about the type of defects. This is because the level of output signal of the filter 35 provides information about the severity of the defect. By contrast, prior methods such the bit-error method, only indicate whether there is an error within a range of data signals. In a method according to the present invention, the false alarm rate and the missed defect rate can be controlled by changing the value of the thresholds described above.

The threshold values utilized in the defect detector 30 are programmable and can be selected to detect desired defects types. The threshold values can also be selected for desired false alarm and defect rates. For example, to reduce the false alarm rate, the values of the thresholds TH1 and TH2 can be made small and the value of the threshold TH3 can be made large. However, to reduce the missed defect rate, the opposite is performed by increasing the values of thresholds TH1 and TH2 and decreasing the value of the threshold TH3. Similarly, the coefficient values for the discrete time filter 35 can be programmable to select desired impulse responses for the filter 35 according to the data pattern written to the medium 15 and according to the type of defect to be detected by the detector 30.

Figure 5:
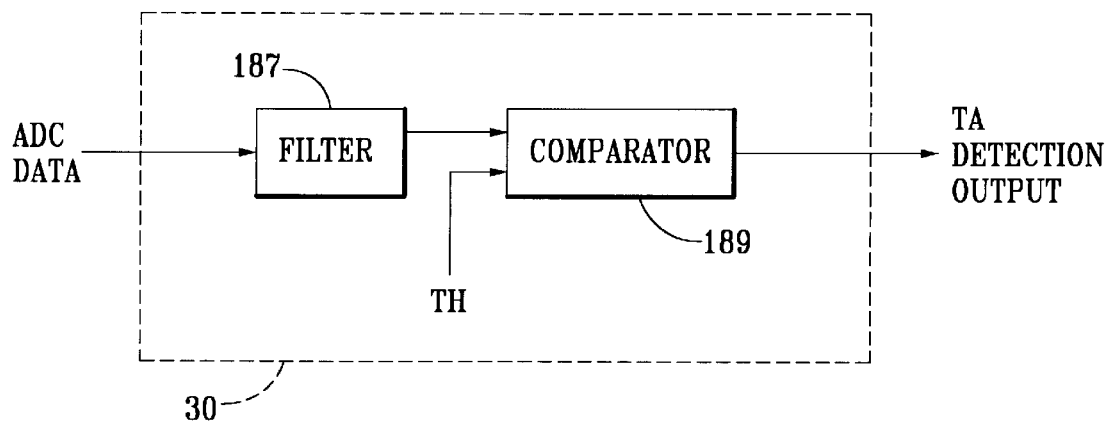
FIG. 5 shows an example block diagram of the architecture of another embodiment of the defect detector of FIG. 1.

As describe above, discrete-time filtering is utilized to detect media defects such as TA defects on the recording medium. For detecting a TA defect it is not necessary to first record a data pattern on the recording medium 15. However, for efficiency, it is desirable to write a data pattern such as the 2T pattern above, to identify defects and TA's on the same pass. A data pattern is generated and written to at least a portion of the medium 15. Thereafter analog data signals corresponding to the data pattern are read from said portion of the medium 15 using a magnetic read head positioned over the magnetic medium 15. The data signals are converted to discrete data and sampled by the sampler 25 to generate discrete time sample data, such as 6-bit data samples. Referring to FIG. 5, the sample data is processed in the discrete time filter 187 to detect deviation of the signal corresponding to media defects. The output of the filter 187 is compared to one or more threshold values by the comparator 189 to identify TA defects.

Figure 6:
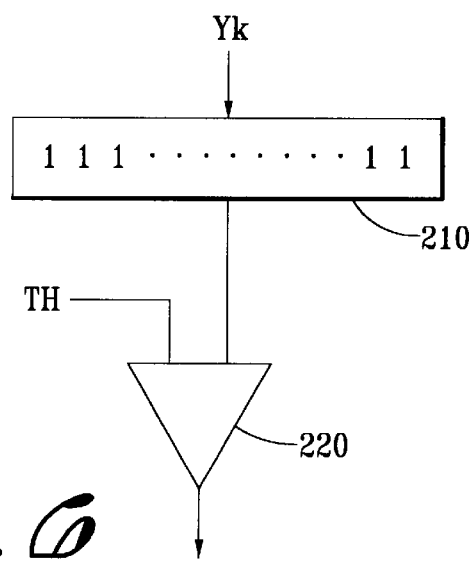
FIG. 6 shows an example architecture of a logic circuit implementation of the defect detector of FIG. 6.

A typical voltage transient generated by a TA defect has a characteristic shape comprising a rapid linear rising edge followed by a slower exponential decay. If the shape of a TA defect voltage transient is known, a preferred TA defect detection filter 35 comprises a filter configured to have a response substantially matched to the shape of the TA defect voltage transient reversed in time. Alternatively, as shown in FIG. 6, a moving average (MA) filter 210 for detecting TA's can be utilized. An MA filter 210 of length N averages N consecutive data samples and can be implemented with coefficients 1, 1, 1 . . . 1, 1, wherein the output of the MA filter 210 is divided by N. A TA defect is detected when the output of the MA filter 210 is larger than a certain selected threshold.

For the 2T data pattern described above, the pattern period is four, because the binary pattern repeats after every four bit cells or Ts. With the 2T data pattern, the sinusoidal read signal corresponding to the 2T data pattern, rides the TA defect voltage transient signal. As such, preferably, the MA filter 210 has a length being a multiple of the data pattern period, whereby only the data pattern peaks in a period are summed by the MA filter 210, and due to the sinusoidal nature of the data signal, the sum is zero. As such, only the deviation of the signal corresponding to the TA defect is detected by the MA filter 210. For the 2T data pattern, an MA filter 210 with a length being a multiple of four results in superior TA defect detection. This is because in the absence of a TA defect, the noiseless output of the MA filter 210 would be zero.

FIG. 6 shows an example architecture of a logic circuit implementation of the defect detector of FIG. 5 utilizing an MA filter 210 of length twenty four and twenty four coefficients, each being equal to one. The filter input is the sampled output $Y_k$ of the ADC 180 wherein k comprises 0, 1, 2, . . . . The output of the MA filter 210 is scaled by dividing by 24, the length of the filter. The logic circuit 215 further comprises a comparator 220, wherein the scaled output of the MA filter 210 and a threshold value TH are input to the comparator 220. If the output of the MA filter 210 is greater than the threshold value TH, then the output of the comparator 220 is 1, indicating a TA defect on the medium 15 corresponding to the sample data processed by the MA filter 210.

Otherwise, the output of the comparator 220 is zero, indicating no TA defect on the medium 15 corresponding to the sample data processed by the MA filter 210.

TA defect detection according to the present invention provides more accurate identification of TA defects than prior approaches using analog low pass filters. According to the present invention, the TA defect detection capacity is improved by about 2.5 dB compared to the prior approach. This is especially beneficial for identifying small TA defects which can become larger over time due to accumulation of debris on the recording medium. The method of the present invention also provides more accurate identification of larger TA defects.

Figure 7:
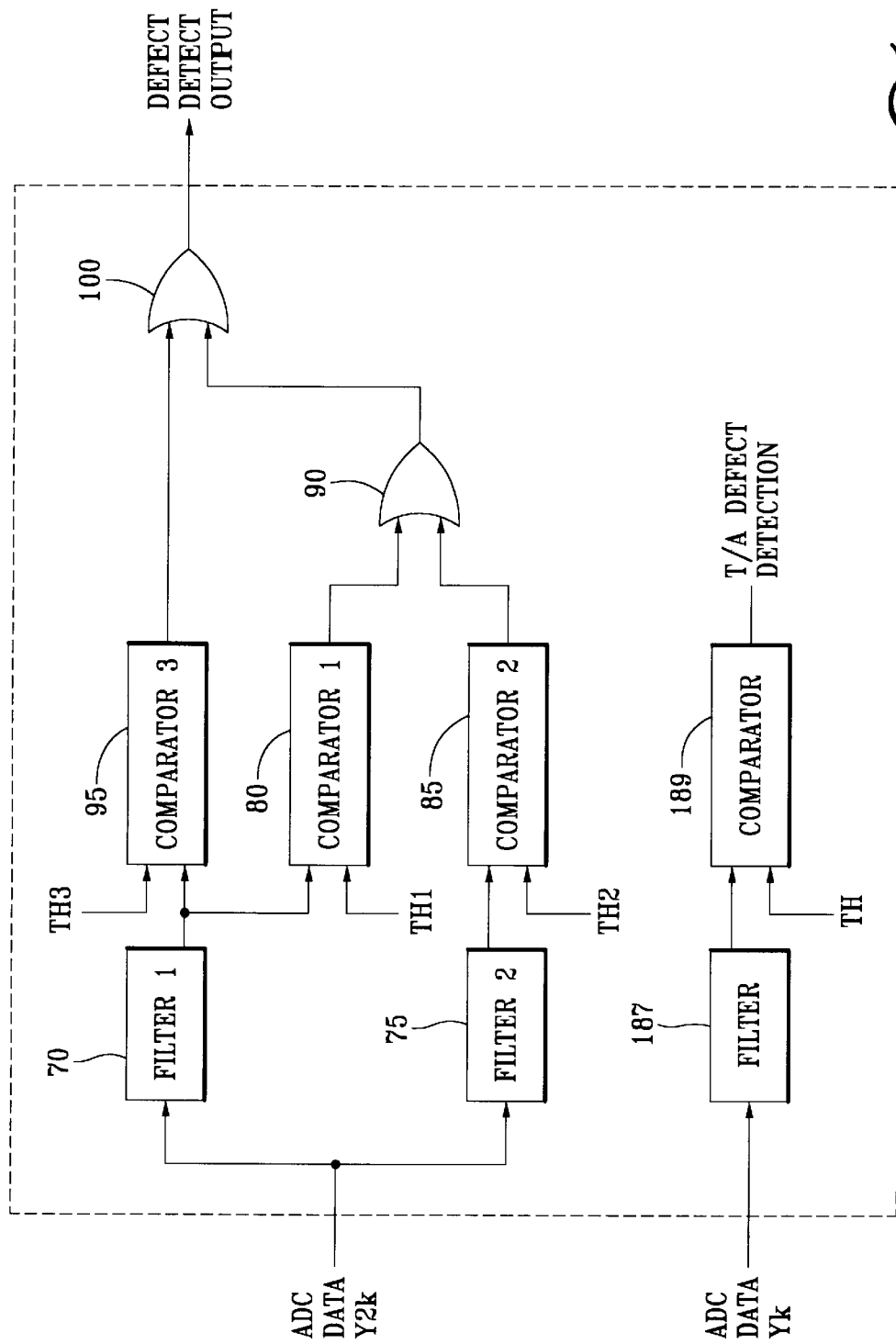
FIG. 7 shows an example block diagram of the architecture of an embodiment of a defect detector for detecting dropins, dropouts and TA defects, according to another aspect of the present invention.

Referring to FIG. 7, in another embodiment of the present invention, the defect detectors 30 of FIGS. 3 and 6 can be combined to form an integrated defect detector 225 for detecting dropins, dropouts and TA defects. The defect detector 225 includes the components of the detectors 30 described above. The defect detector 225 can further comprise additional filters and corresponding comparators for detecting additional defect types.

Although the present invention has been described in considerable detail with regard to the preferred versions thereof, other versions are possible. Therefore, the appended claims should not be limited to the descriptions of the preferred versions contained herein.

What is claimed is:

1. In a magnetic recording system, a method for detecting media defects on a recording medium comprising the steps of:
    (a) reading data signals from at least a portion of the medium;
    (b) sampling the data signals to generate discrete time sample data;
    (c) processing the sample data in a discrete time filter to detect deviation of the signal corresponding to media defects, wherein the discrete time filter comprises a moving average filter; and
    (d) comparing the deviation of the signal to one or more threshold values to identify corresponding defect types on the recording medium.

2. The method of claim 1, wherein the discrete time filter is configured to have an impulse response substantially matched to deviation of the signal corresponding to media defects.

3. The method of claim 2 further comprising the step of recording a data pattern on said portion of the medium before reading the data signals, wherein the data pattern causes said data signals to have a substantially predetermined shape.

4. The method of claim 3, wherein the data pattern comprises a deterministic data pattern.

5. The method of claim 4, wherein the data pattern comprises a periodic data pattern.

6. The method of claim 5, wherein the data pattern comprises a 2T data pattern having a period of 4.

7. The method of claim 6, wherein the discrete time filter includes coefficients comprising one or more repetitions of at least a portion of the sequence 1, 0, −1 and 0.

8. The method of claim 5, wherein the discrete time filter has a length being a multiple of the period of the data pattern.

9. The method of claim 3, wherein the data pattern comprises a random data pattern.

10. The method of claim 3 wherein the step of processing the sample data further comprises processing the sample data using a plurality of discrete time filters to detect deviation of the signal corresponding to media defects.

11. The method of claim 10, wherein each filter is configured to have an impulse response substantially matched to deviation of the signal corresponding to a type of defect on the medium.

12. The method of claim 11, wherein the data pattern comprises a 2T data pattern having a period of 4.

13. The method of claim 12, wherein at least one of the discrete time filters includes coefficients comprising one or more repetitions of at least a portion of the sequence 1, 0, −1 and 0.

14. The method of claim 13, wherein at least one of the discrete time filters has a length being a multiple of four of the period of the data pattern.

15. The method of claim 10, wherein at least one of the discrete time filters comprises a moving average filter.

16. The method of claim 1, wherein the discrete time filter is configured as a moving average filter substantially matched to deviation of the signal corresponding to media defects.

17. In a magnetic recording system, a method for detecting defects on a recording medium comprising the steps of:
   (a) recording a data pattern on at least a portion of the medium;
   (b) reading data signals from said portion of the medium;
   (c) sampling the data signals to generate discrete time sample data;
   (d) processing the sample data using a discrete time filter configured to have an impulse response substantially matched to the data pattern, the filter generating filtered data, wherein the discrete time filter comprises a moving average filter; and
   (e) comparing the filtered data to one or more threshold values to detect defects recording medium.

18. The method of claim 17, wherein the data pattern comprises a deterministic data pattern.

19. The method of claim 18, wherein the data pattern comprises a periodic data pattern.

20. The method of claim 19, wherein the data pattern comprises a 2T data pattern having a period of 4.

21. The method of claim 20, wherein the discrete time filter includes coefficients comprising one or more repetitions of at least a portion of the sequence 1, 0, −1 and 0.

22. The method of claim 19, wherein the discrete time filter has a length being a multiple of the period of the data pattern.

23. The method of claim 17, wherein the data pattern comprises a random data pattern.

24. A detector for detecting defects on a recording medium from data signals read from the recording medium, the detector comprising:
   (a) a sampling system for sampling the data signals to generate discrete time sample data;
   (b) a processor for processing the sample data, the processor comprising one or more discrete time filters for detecting deviation of the signal corresponding to media defects, wherein at least one of the discrete time filters approximates a moving average filter; and
   (c) one or more comparators for comparing the deviation of the signal to one or more threshold values to identify defects on the recording medium.

25. The detector of claim 24, wherein at least one of the discrete time filter is configured to have an impulse response substantially matched to deviation of the signal corresponding to a media defect.

26. The detector of claim 24, wherein at least one of the discrete time filters includes programmable coefficients for programming the filter's impulse response.

27. The detector of claim 24, wherein at least one of the discrete time filters comprises a moving average filter.

28. The detector of claim 24 further comprising a recorder for generating and recording a data pattern on said portion of the medium.

29. The detector of claim 28, wherein the data pattern comprises a periodic data pattern.

30. The detector of claim 29, wherein the data pattern comprises 2T data pattern having a period of 4.

31. The detector of claim 30, wherein at least one of the discrete time filters includes coefficients comprising one or more repetitions of at least a portion of the sequence 1, 0, −1 and 0.

32. The detector of claim 29, wherein at least one of the discrete time filters has a length being a multiple of the period of the data pattern.

33. The detector of claim 28, wherein the data pattern comprises a random data pattern.

34. The detector of claim 24, wherein at least one of the discrete time filters is configured as a moving average filter substantially matched to deviation of the signal corresponding to media defects.

* * * * *